(12) United States Patent
Zhu et al.

(10) Patent No.: US 8,497,197 B2
(45) Date of Patent: Jul. 30, 2013

(54) METHOD FOR MANUFACTURING A HIGH-PERFORMANCE SEMICONDUCTOR STRUCTURE WITH A REPLACEMENT GATE PROCESS AND A STRESS MEMORIZATION TECHNIQUE

(75) Inventors: Huilong Zhu, Poughkeepsie, NY (US); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 33 days.

(21) Appl. No.: 13/061,296

(22) PCT Filed: Sep. 26, 2010

(86) PCT No.: PCT/CN2010/001485
§ 371 (c)(1),
(2), (4) Date: Feb. 28, 2011

(87) PCT Pub. No.: WO2012/027865
PCT Pub. Date: Mar. 8, 2012

(65) Prior Publication Data
US 2012/0252198 A1    Oct. 4, 2012

(30) Foreign Application Priority Data
Aug. 31, 2010 (CN) .......................... 2010 1 0269267

(51) Int. Cl.
*H01L 21/3205* (2006.01)
(52) U.S. Cl.
USPC .......................................... 438/585; 438/584

(58) Field of Classification Search
USPC ................. 438/585, 478, 423, 766, 294, 400, 438/143, 174, 181, 138, 514, 527, 914; 257/E21.618, E21.621, E21.63, E21.633, 257/E21.644; 250/492.1, 492.2, 492.21
See application file for complete search history.

(56) References Cited

U.S. PATENT DOCUMENTS

| | | | |
|---|---|---|---|
| 6,245,618 B1 * | 6/2001 | An et al. ....................... | 438/289 |
| 6,627,488 B2 * | 9/2003 | Lee ............................... | 438/183 |
| 7,682,887 B2 * | 3/2010 | Dokumaci et al. ........... | 438/175 |
| 2002/0001930 A1 | 1/2002 | Lee | |
| 2008/0286916 A1 * | 11/2008 | Luo et al. ....................... | 438/197 |
| 2010/0102394 A1 * | 4/2010 | Yamakawa et al. ........... | 257/369 |
| 2011/0256683 A1 * | 10/2011 | Zhu et al. ...................... | 438/290 |

FOREIGN PATENT DOCUMENTS

CN    101641780 A    2/2010

* cited by examiner

*Primary Examiner* — Charles Garber
*Assistant Examiner* — Brigitte Paterson
(74) *Attorney, Agent, or Firm* — Osha Liang LLP

(57) ABSTRACT

A method for manufacturing a semiconductor structure includes providing an n-type field effect transistor comprising a source region, a drain region, and a first gate; forming a tensile stress layer on the n-type field effect transistor; removing the first gate so as to form a gate opening; performing an anneal so that the source region and the drain region memorize a stress induced by the tensile stress layer; forming a second gate; removing the tensile stress layer; and forming an interlayer dielectric layer on the n-type field effect transistor. A replacement process is combined with a stress memorization technique for enhancing the stress memorization effect and increasing mobility of electrons, which in turn improves overall properties of the semiconductor structure.

11 Claims, 7 Drawing Sheets

METHOD FOR MANUFACTURING A HIGH-PERFORMANCE SEMICONDUCTOR STRUCTURE WITH A REPLACEMENT GATE PROCESS AND A STRESS MEMORIZATION TECHNIQUE

BACKGROUND OF THE INVENTION

1. Field of Invention

The present invention relates to a method for manufacturing a semiconductor structure, in particular, to a method for manufacturing a high-performance semiconductor structure with a replacement gate process and a stress memorization technique.

2. Description of Prior Art

It is well known that stress is applied to and improves properties of a field effect transistor (FET). When applied in a longitudinal direction of a channel (i. e. a direction of electric current), tensile stress increases mobility of electrons (i. e. a driving current of nFET), and compressive stress increases mobility of holes (i. e. a driving current of pFET).

One of the approaches for providing such stress is so-called SMT (stress memorization technique), which comprises forming a material having intrinsic stress, such as silicon nitride, at various locations of a semiconductor structure, for example above a channel region; annealing so that the stress is memorized at the respective locations, such as a gate region or an extension region; and removing the stress material. Thus, the stress remains and increases mobility of electrons or holes, which in turn improves overall properties of the semiconductor structure.

Up to now, the prior-art stress memorization technique is used in a gate-first process in which a stress material is first formed and then removed after formation of a gate. A part of the stress introduced by a layer of the stress material is offset by the gate conductor formed previously, which diminishes a stress memorization effect.

Therefore, there still needs a stress memorization technique which is compatible with a gate-last process (referred also as a replacement gate process) and has the effect of further enhancing stress.

SUMMARY OF THE INVENTION

In view of the above problems, one object of the present invention is to provide a method for manufacturing a semiconductor structure which incorporates both a stress memorization technique and a gate-last process.

According to one aspect of the invention, there provides a method for manufacturing a semiconductor structure, comprising:

a) providing an n-type field effect transistor comprising a source region, a drain region, and a first gate;

b) forming a tensile stress layer on the n-type field effect transistor;

c) removing the first gate so as to form a gate opening;

d) annealing so that the source region and the drain region memorize a stress induced by the stress layer;

e) forming a second gate;

f) removing the tensile stress layer; and g) forming an interlayer dielectric layer on the n-type field effect transistor.

Preferably, the tensile stress layer comprises at least one selected from the group consisting of $Si_3N_4$, $SiO_2$, SiOF, SiCOH, SiO, SiCO, SiCON, SiON, PSG and BPSG.

Preferably, in step b), the tensile stress layer is formed by a deposition process.

Preferably, between the steps a) and b), an etching stop layer is formed by a deposition process.

Preferably, the etching stop layer comprises $SiO_2$.

Preferably, the first gate comprises a dummy gate conductor and a first gate dielectric layer.

Preferably, in step c), the dummy gate conductor is removed by etching so as to expose the first gate dielectric layer below the dummy gate conductor.

Preferably, the first gate dielectric layer is removed by etching so as to expose a substrate below the first gate dielectric layer.

Preferably, between the steps d) and e), performing an ion implantation through the gate opening so as to form a super-steep retrograde well region.

Preferably, the super-steep retrograde well region includes p-type dopants.

Preferably, the p-type dopant comprises boron, indium or a combination thereof.

The replacement gate process and the stress memorization technique are combined with each other in the present method for manufacturing a semiconductor structure, and the stress is applied in situ by a stress material while removing the gate conductor, so that the source/drain region memorizes enhanced stress and thus mobility of electrons, which in turn improves overall properties of the semiconductor structure. These and other features, aspects and advantages of the present invention will be apparent by reading the following description and claims.

DETAILED DESCRIPTION OF PREFERRED EMBODIMENTS

The present invention will be described below with those preferred embodiments in connection with attached drawings. However, it should be understood that the description here is only illustrative, without intend of limiting a protection scope. Also, the following description omits details of those known structure and techniques so that concepts of the invention are not obscured unnecessarily.

Top views, cross-sectional views and perspective views of various structures of the semiconductor structure according to the embodiments of the present invention are shown in attached drawings. However, these figures are not drawn in scale, and some details may be enlarged and other details may be omitted for simplicity. Shapes, relative sizes and positions of various regions/layers shown in the figures are only illustrative. Variations may exist due to manufacturing tolerance and technical limitations. Moreover, those skilled in the art may design the regions/layers having different shapes, relative sizes and positions as required.

Figure 1:
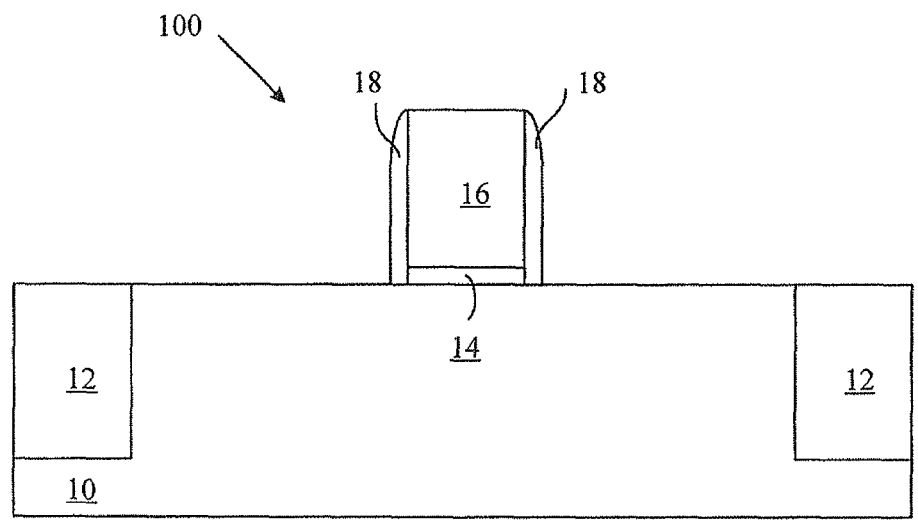
FIG. 1 shows a cross-sectional view of an initial semiconductor structure according to one embodiment of the present method.

According to the embodiment of the present invention, there provides a method for manufacturing a high-performance semiconductor structure with a replacement gate process and a stress memorization technique, so that the source/ drain region memorizes enhanced stress and thus mobility of electrons, which in turn improves overall properties of the semiconductor structure FIG. 1 shows a cross-sectional view of an initial structure according to one embodiment of the present method.

The initial structure is an n-type field effect transistor (nFET) 100. In the nFET 100 shown in FIG. 1, a substrate 10 is subjected to some previous processing steps, such as formation of a conventional shallow trench isolation (STI) 12, well implantation, formation of a gate dielectric layer 14, formation of a dummy gate conductor 16, and formation of a first sidewall spacer 18.

FIGS. 2-13 show cross-sectional views of the semiconductor structure at intermediate stages of the process flow according to one embodiment of the present method.

Figure 2:
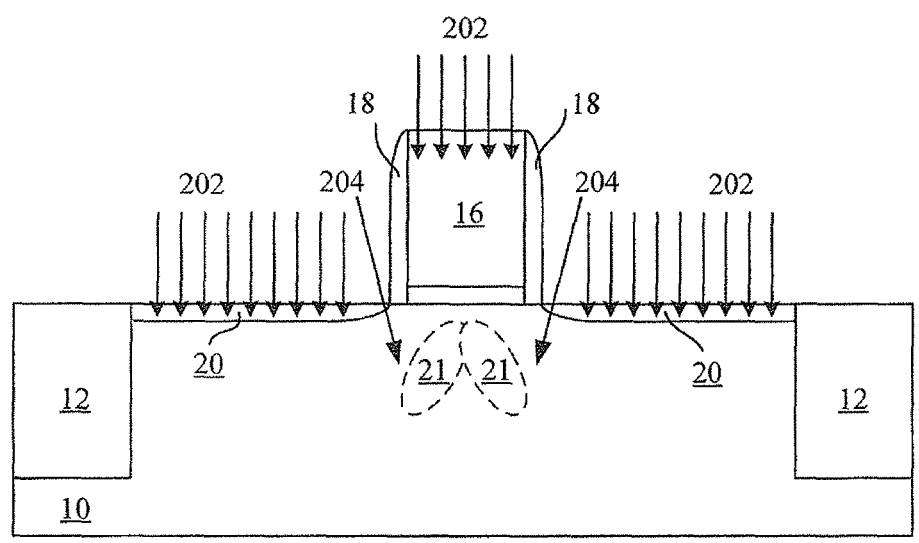
FIGS. 2-13 show cross-sectional views of the semiconductor structure at intermediate stages of the process flow according to one embodiment of the present method.

Preferably, according to one embodiment of the present method, an extension implantation is performed on the initial structure of the nFET 100, as shown in FIG. 2. Optionally, a halo implantation is further performed.

In the extension implantation, the dummy gate conductor 16 and the first sidewall spacer 18 are used as a mask, and ions are implanted in a direction indicated by arrow 202 to provide extension regions 20 in the exposed portions of the substrate 10 at both sides of the dummy gate conductor 16 and the first sidewall spacer 18. For the nFET in the illustrated embodiment of the present invention, n-type dopants such as As, P or their combination can be used in the extension implantation. The extension region 20 has the effect of reducing a peak value of electric field, and thus suppressing a short channel effect.

In the halo implantation, the dummy gate conductor 16 and the first sidewall spacer 18 are used again as a mask, and ions are implanted in a direction indicated by arrow 204 in an oblique angle to provide halo regions 21 in the portions of the substrate 10 below the gate dielectric 14. For the nFET in the illustrated embodiment of the present application, p-type dopants such as B, $BF_2$, indium (In) or their combinations can be used in the halo implantation. The halo regions 21 have the effect of preventing the source/drain region 24 to be formed in a subsequent step (as shown in FIG. 3) from diffusing into the channel region, and thus suppressing a short channel effect.

Figure 3:
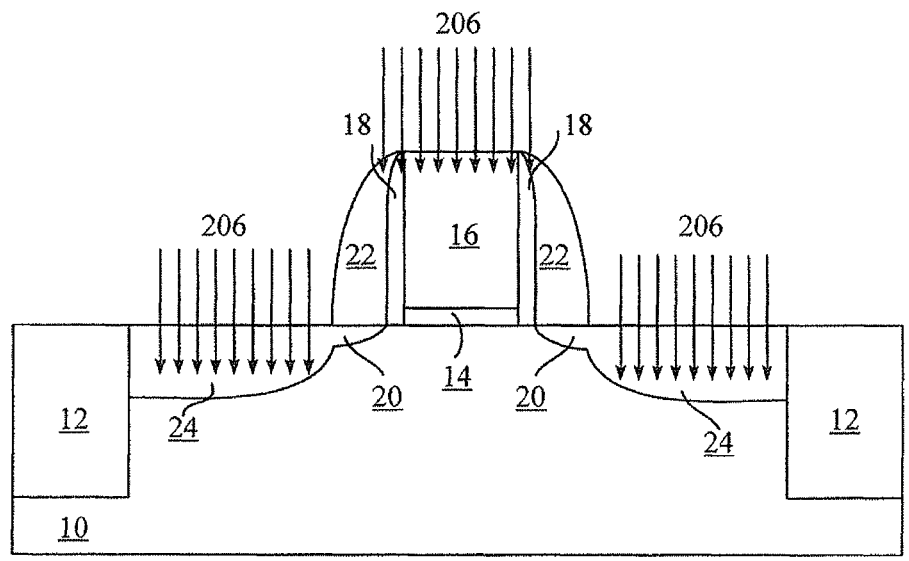

As sown in FIG. 3, a second sidewall spacer 22 is formed at both sides of the dummy gate conductor 16 and the first sidewall spacer 18, and a source/drain region 24 is then formed.

For example, the second sidewall spacer 22 as shown in FIG. 3 can be formed by firstly deposition a material of the second sidewall spacer on the whole is semiconductor structure by a conventional deposition process such as physical vapor deposition (PVD), chemical vapor deposition (CVD), atomic layer deposition (ALD), sputter, and the like, and then performing anisotropic etching, preferably reactive ion etching (RIE). The material of the second sidewall spacer 22 can be the same as or different from that of the first sidewall spacer 18. Preferably, the second sidewall spacer 22 may comprise $Si_3N_4$. In subsequent steps, the second sidewall spacer 22 serves as a mask and/or a protection layer against etching.

The dummy gate conductor 16 and the second sidewall spacer 22 are used as a mask, and ions are implanted in a direction indicated by arrow 206 to provide a source/drain region 24 in the exposed portions of the substrate 10 at both sides of the dummy gate conductor 16 and the second sidewall spacer 22. For the nFET in the illustrated embodiment of the present invention, n-type dopants such as As, P or their combination can be used in the source/drain implantation. Typically, the dopant for the source/drain region 24 and that for the extension region 20 are of the same polarity, but can employ the same or different types of species and doping levels.

Figure 4:
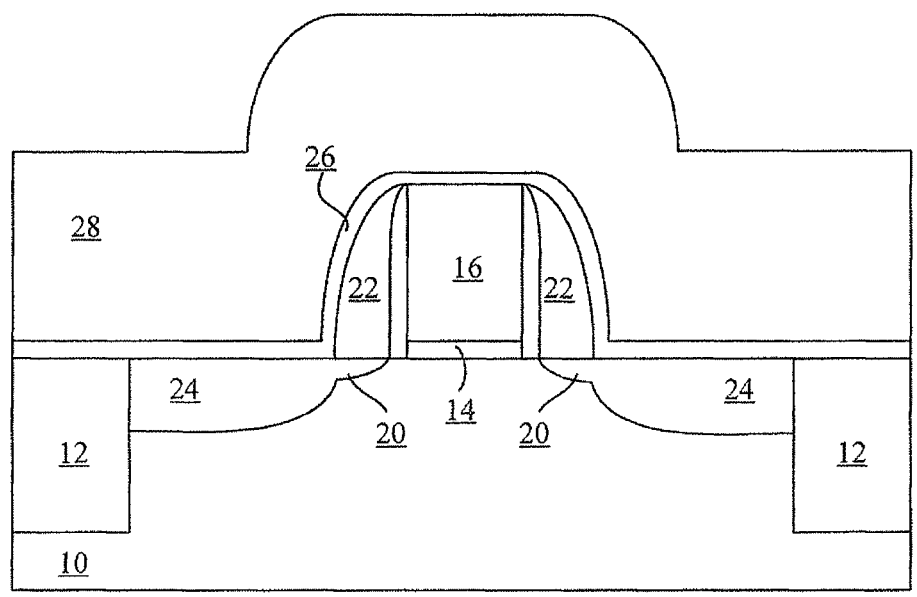

As shown in FIG. 4, an etching stop layer 26 and a tensile stress layer 28 are formed in sequence on the semiconductor structure shown in FIG. 3.

Here, the two layers may be formed for example by the above conventional deposition process. Typically, the etching stop layer 26 may comprise $SiO_2$, and the tensile stress layer 28 may comprise at least one selected from the group consisting of $Si_3N_4$, $SiO_2$, SiOF, SiCOH, SiO, SiCO, SiCON, SiON, PSG and BPSG. Optionally, the etching stop layer 26 may be formed by thermal oxidation.

Figure 5:
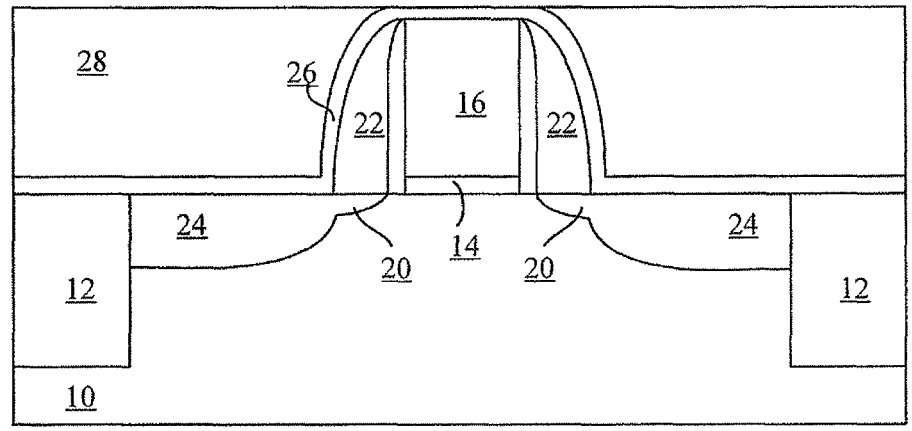

As shown in FIG. 5, a planarization process is performed on the tensile stress layer 28, for example by CMP (chemical mechanical polishing). The planarization process stops on the top of the etching stop layer 26 so as to provide a flat surface for the semiconductor structure.

Figure 6:
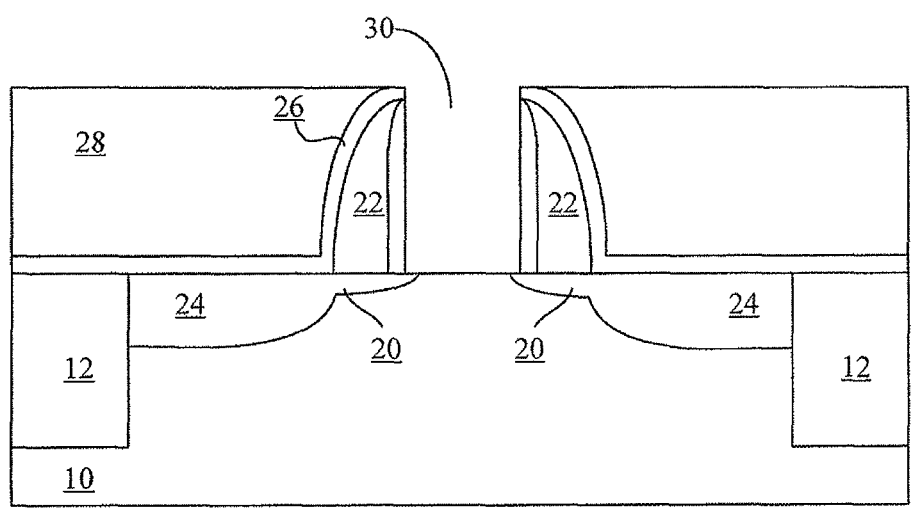

As shown in FIG. 6, the etching stop layer 26 above the dummy gate conductor 16 and the dummy gate conductor 16 itself are etched away in sequence for example by reactive ion etching (RIE) which stops on the top of the gate dielectric layer 14, to provide a gate opening 30.

Optionally, the gate dielectric layer 14 may also be etched away by an etching is process which stops on the substrate 10 below the gate dielectric layer 14.

An anneal treatment is performed on the semiconductor structure to memorize the stress from the tensile stress layer 28 and activate dopants in the extension region 20 and the source/drain region 24 (as well as the halo region 21, it there is), during which the defects in the semiconductor material and at the surface of the semiconductor material are also remedied.

For this purpose, a rapid thermal anneal (RTA) is for example performed at about 1000° C. for about 0-1 second in one embodiment of the present invention.

According to the method for manufacturing the semiconductor structure according to the present invention, the stress is memorized by depositing the tensile stress layer, followed by removing the dummy gate conductor and annealing. Because the dummy gate conductor is removed, the stress concentrates in the source/drain region, which achieves an enhanced stress memorization effect compared with the prior-art method which incorporates both a stress memorization technique and a gate-first process.

As known from FIG. 6, the extension region 20 diffuses into the channel region below the gate dielectric 14 after annealing.

Figure 7:
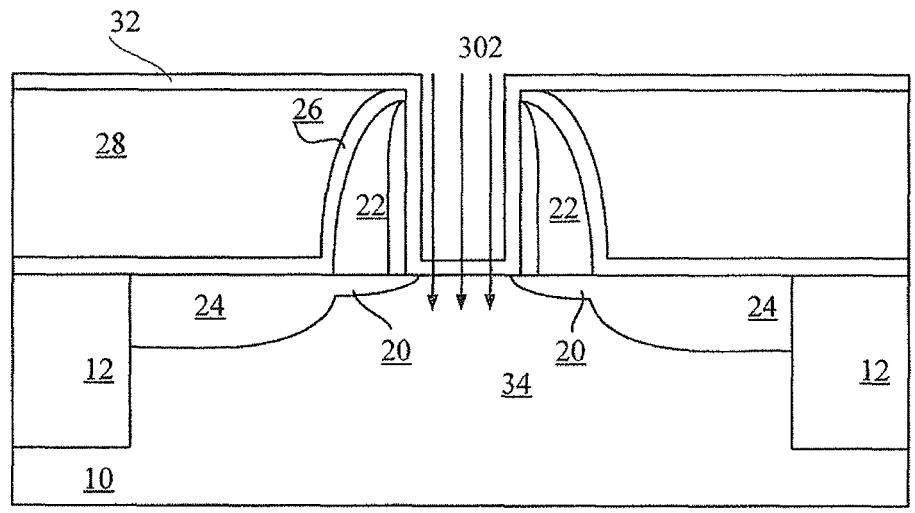

As shown in FIG. 7, a high K dielectric layer 32 is formed on the whole semiconductor structure shown in FIG. 6, for example by the above conventional deposition process.

Optionally, an activation anneal is performed after deposition of the high K dielectric layer 32, so as to remedy a molecular constitution of the high K dielectric layer, and thus improve the reliability of the high K dielectric layer.

Non-limiting examples of the material of the high K dielectric layer 32 include Hf-based materials, such as $HfO_2$, HfSiO, HfSiON, HfTaO, HfTiO or HfZrO, zirconia, lanthana, titanium oxide, BST (barium strontium titanate), or PZT (lead zirconate titanate).

Figure 8:
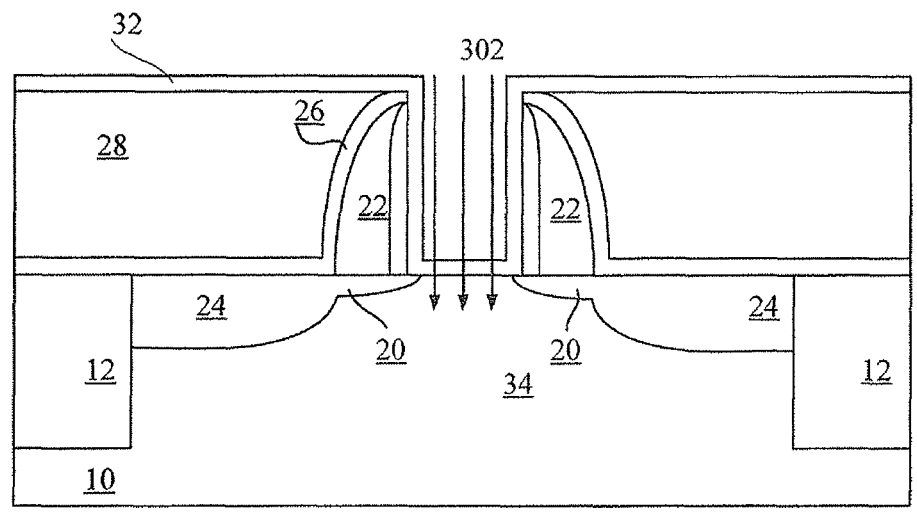

Preferably, ions may be implanted through the gate opening 30 in a direction indicated by arrow 302 shown in FIG. 7, followed by an anneal (for example a laser anneal) for activating the implanted ions, to provide an SSRW (super-steep-retrograded well) 34 in the portions of the substrate 10 below the gate dielectric 14, as shown in FIG. 8.

The gate opening 30 provides a window for ion implantation for SSRW. Preferably, the dopant for SSRW implantation and that for extension implantation are of opposite polarities. For example, p-type dopants such as B, $BF_2$, indium (In) or their combinations can be used in the SSRW implantation for an n-MOSFET.

The resultant SSRW 34 may comprise two separate halos, or two overlapped halos (not shown). The SSRW 34 has the effect of suppressing a short channel effect and improving properties of the semiconductor structure, because the SSRW 34 has varying doping level along a gate length which controls the channel region in an effective manner.

It should be noted that a gate length of the semiconductor structure has a remarkable effect on a peak value of doping level in the SSRW. Compared with the semiconductor structure having a relatively larger gate length, the peak value of doping level in the SSRW is higher in the semiconductor structure having a relatively smaller gate length, and the doping effect is better.

In the embodiment of the preset invention, the above SSRW implantation can be performed in situ because the gate opening 30 provides a window for ion implantation and the high K dielectric layer 32 on the surface of the tensile stress layer 28 serves as a hard mask. Thus, the number of the masks is reduced and the process is simplified.

Figure 9:
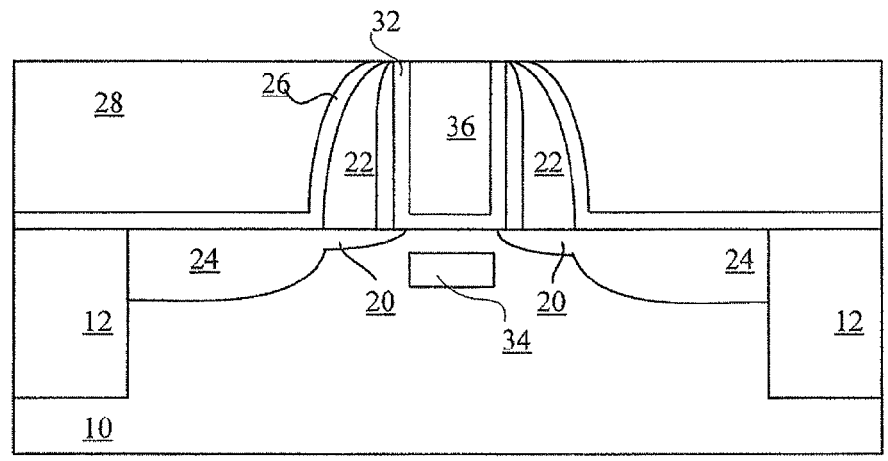

As shown in FIG. 9, a new gate conductor layer 36 is formed for example by the above conventional deposition process, which covers the whole semiconductor structure. The gate conductor layer 36 and the high K layer 32 is subjected to a planarization, such as CMP (chemical mechanical polishing). The planarization process stops at the top of the tensile stress layer 28 so as to provide a flat surface for the semiconductor structure.

The gate conductor layer 36 may be made of but not limited to metal, alloy, metal nitride, metal silicide, stack or combination thereof. Here, the gate conductor layer 36 preferably comprises a stack of a work function layer and a gate metal layer. Non-limiting examples of the work function layer include TIN, TiAlN, TaN, TaAlN, and their combinations. If there is a work function layer, it is arranged between the gate metal layer and the gate dielectric layer.

Figure 10:
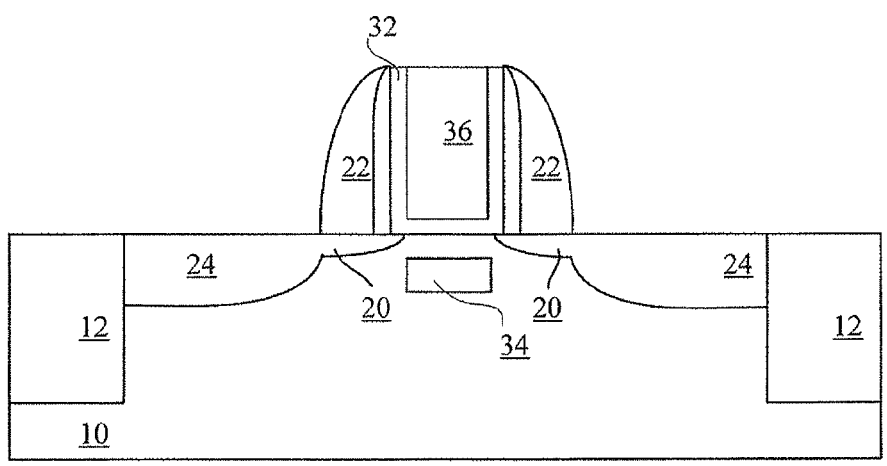

As shown in FIG. 10, the tensile stress layer 28 is removed. For example, the tensile stress layer 28 may be removed by wet etching which stops on the etching stop layer 26.

Here, after the previous steps, the etching stop layer 26 becomes very thin and even can be omitted (not shown).

Figure 11:
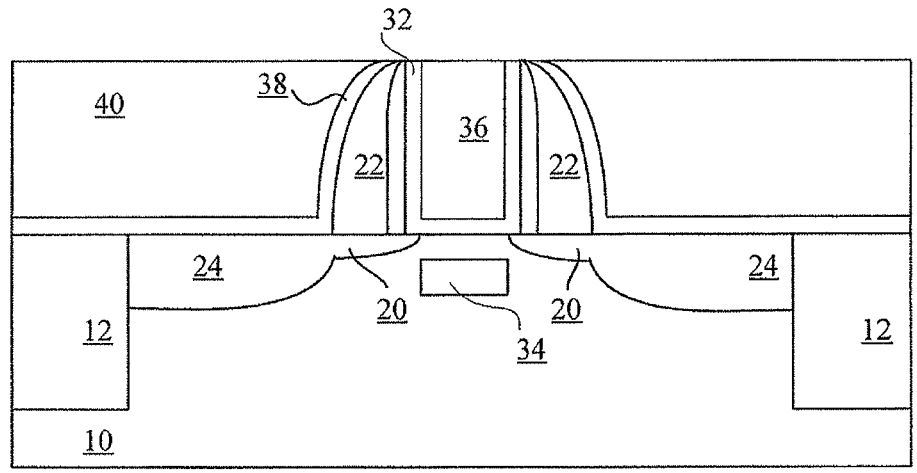

Optionally, a thin first protection layer 38 is then formed on the whole semiconductor layer, preferably of silicon nitride, for example by a deposition process, as shown in FIG. 11.

Further, an inter-layer dielectric (ILD) 40 is formed on the whole semiconductor structure by a deposition process, followed by a planarization process such as CMP which stops on the gate conductor 36.

The ILD 40 preferably comprises silicon dioxide, and may also comprise various doped silicon oxides such as boron silicate glass, boron phosphorous silicate glass, and the like).

Figure 12:
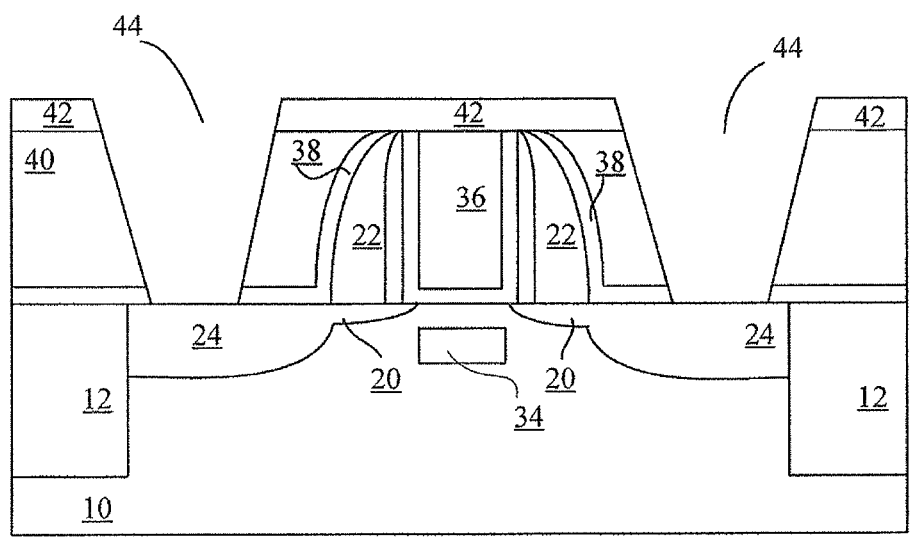
Figure 13:
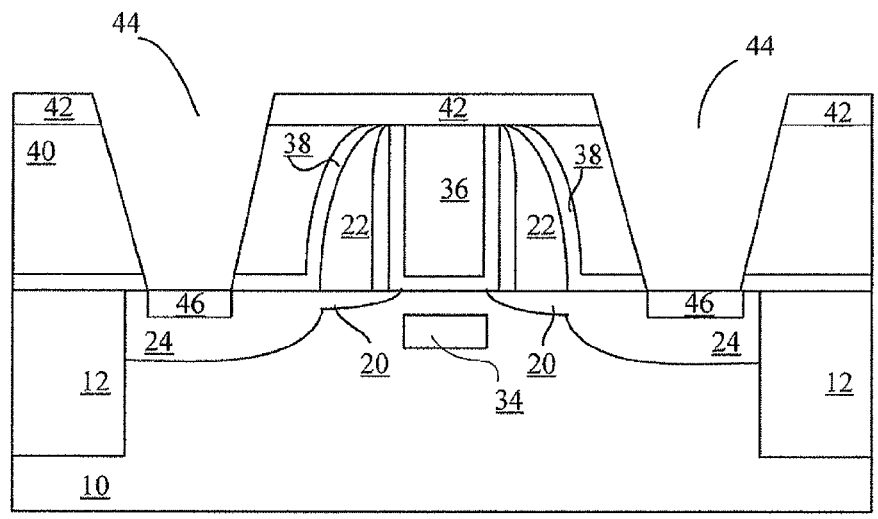
Figure 14:
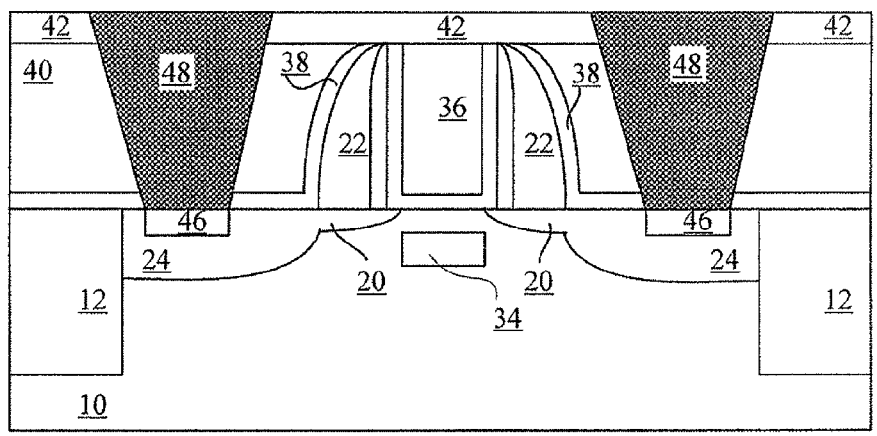
FIG. 14 shows a cross-sectional view of a semiconductor structure manufactured according to one embodiment of the present method.

As shown in FIGS. 12-14, vias and silicides are formed in a conventional manner for the semiconductor structure shown in FIG. 11.

A second protection layer 42 is then formed on the whole semiconductor layer, for example by a deposition process, as shown in FIG. 12.

Typically, the second protection layer 42 may comprise silicon nitride and has a thickness of about 10 nm-20 nm.

Optionally, a mask (for example of a photoresist) is formed and patterned on the semiconductor structure covered with the second protection layer 42, subsequently, via holes 44 in the ILD 40 at predetermined locations is formed by etching, as shown in FIG. 12.

The via holes 44 extend through the second protection layer 42, the ILD 40 and the first protection layer 38 (if there is). The substrate 10 is exposed at the bottom of the via holes 44.

A metal layer is then formed by a deposition process, which fills the via holes 44 and covers the second protection layer 42, as shown in FIG. 13. Typically, the metal layer has a thickness of about 3 nm-10 nm. The metal layer preferably comprises NiPt.

An annealing process is performed at about 250° C.-500° C. so that the metal in the via holes reacts with the underlying silicon to provide a silicide layer 46.

Here, the silicide layer 46 preferably comprises NiPtSi. The silicide layer 46 reduces a contact resistance between the source/drain region 24 and the metal plug 48 to be formed in the via holes (as will be shown in FIG. 14).

The unreacted metal is then selectively removed by wet etching in which a solution of sulfuric acid is for example used.

As shown in FIG. 14, a metal plug 48 may be formed in each of the via holes 44, so that the metal plug 48 contacts the underlying silicide region 46 at the corresponding locations.

For this, a liner (not shown, for example of TiN, TaN, Ta, or Ti) is firstly deposited, and a conductive metal (for example of Ti, Al, TiAl, Cu, W, and the like) is then deposited, followed by a planarization (for example CMP) of the metal.

The present method for manufacturing the semiconductor structure incorporates a replacement process and a stress memorization technique. When the stress is induced (in the step shown in FIG. 3), the dummy gate conductor has been previously removed and the stress concentrates in the source/drain region, which enhances the stress memorization effect and thus mobility of electrons, which in turn improves overall properties of the semiconductor structure. Although a specific semiconductor structure shown in FIG. 14 is described in the above embodiment, one skilled person will understand that above replacement process and stress memorization technique can be applied to various semiconductor devices which may benefit from increased mobility of electrons due to stress.

In the above description, no details are given for those conventional operations. Nevertheless, one skilled person will understand the layers and regions having desired shapes can be formed by various approaches well known in the field. Moreover, one skilled person may propose a process completely different from the above processes for providing the same structure.

While the invention has been described with reference to specific embodiments, the description is only illustrative of the invention. The description is not to be considered as limiting the invention. The protection scope is defined by the attached claims and their equivalences. One skilled person will readily recognize that various modifications and changes may be made to the present invention without departing from the true scope of the present invention.

What is claimed is:

1. A method for manufacturing a semiconductor structure, comprising the steps of:
   a) providing an n-type field effect transistor comprising a source region, a drain region, and a first gate;
   b) forming a tensile stress layer on the n-type field effect transistor;
   c) removing the first gate so as to form a gate opening;

d) performing, after the step c), an anneal after removing the first gate so that the source region and the drain region memorize a stress induced by the tensile stress layer;
e) forming, after the step d), a second gate;
f) removing the tensile stress layer; and
g) forming an interlayer dielectric layer on the n-type field effect transistor,
wherein the step d) is performed with the gate opening unfilled.

2. The method according to claim 1, wherein the tensile stress layer comprises at least one selected from the group consisting of $Si_3N_4$, $SiO_2$, SiOF, SiCOH, SiO, SiCO, SiCON, SiON, PSG and BPSG.

3. The method according to claim 1, wherein in step b), the tensile stress layer is formed by a deposition process.

4. The method according to claim 1, wherein after step a) and before step b), an etching stop layer is deposited.

5. The method according to claim 4, wherein the etching stop layer comprises $SiO_2$.

6. The method according to claim 1, wherein the first gate comprises a dummy gate conductor and a first gate dielectric layer.

7. The method according to claim 6, wherein in step c), the dummy gate conductor is removed by an etching process so as to expose the first gate dielectric layer below the dummy gate conductor.

8. The method according to claim 7, wherein the first gate dielectric layer is removed by a further etching process so as to expose a substrate below the first gate dielectric layer.

9. The method according to claim 1, after step d) and before step e), further comprising a step of:
performing an ion implantation through the gate opening so as to form a super-steep retrograde well region.

10. The method according to claim 9, wherein the super-steep retrograde well region comprises a p-type dopant.

11. The method according to claim 10, wherein the p-type dopant comprises boron, indium or a combination thereof.

* * * * *